US008853795B2

(12) United States Patent
Bode et al.

(10) Patent No.: US 8,853,795 B2
(45) Date of Patent: Oct. 7, 2014

(54) SEMICONDUCTOR DEVICE WITH APPRAISAL CIRCUITRY

(75) Inventors: Hubert Bode, Haar (DE); Andreas Laudenbach, Haag (DE); Andreas Roth, Eching (DE)

(73) Assignee: Freescale Semiconductor, Inc., Austin, TX (US)

( * ) Notice: Subject to any disclaimer, the term of this patent is extended or adjusted under 35 U.S.C. 154(b) by 515 days.

(21) Appl. No.: 13/201,977

(22) PCT Filed: Feb. 23, 2009

(86) PCT No.: PCT/IB2009/050720
§ 371 (c)(1),
(2), (4) Date: Aug. 17, 2011

(87) PCT Pub. No.: WO2010/095003
PCT Pub. Date: Aug. 26, 2010

(65) Prior Publication Data
US 2011/0297935 A1    Dec. 8, 2011

(51) Int. Cl.
*H01L 29/66* (2006.01)
*H01L 27/092* (2006.01)
*H01L 21/66* (2006.01)
*H01L 23/58* (2006.01)

(52) U.S. Cl.
CPC .......... *H01L 23/585* (2013.01); *H01L 27/0921* (2013.01); *H01L 22/14* (2013.01); *H01L 22/34* (2013.01)
USPC ....... 257/409; 257/232; 257/233; 257/E23.19

(58) Field of Classification Search
CPC ..... H01L 22/14; H01L 23/34; H01L 29/7815; H01L 29/7826; H01L 23/585; H01L 27/0921
USPC ......... 257/232, 233, 170, 409, 452, 484, 490, 257/495, 48, E23.19, E21.521, E31.052, 257/E29.012, E29.13, E29.2, E21.066
See application file for complete search history.

(56) References Cited

U.S. PATENT DOCUMENTS 4,356,412 A * 10/1982 Moench et al. ................ 327/537
4,388,001 A *  6/1983 Nishikubo ..................... 368/87
(Continued)

FOREIGN PATENT DOCUMENTS

| DE | 19958204 A1 | 6/2001 |
| WO | 2009/071965 A1 | 6/2009 |
| WO | 2009/072041 A1 | 6/2009 |

OTHER PUBLICATIONS

International Search Report and Written Opinion correlating to PCT/IB2009/050720 dated Oct. 7, 2009.

*Primary Examiner* — Cuong Q Nguyen
*Assistant Examiner* — Yosef Gebreyesus

(57) ABSTRACT

A semiconductor device comprises a substrate provided with a doping of a first type, on which an electronic circuit is provided surrounded by a circuit portion of the substrate provided with a doping of a second type; at least one pad for connecting the electronic circuit to an external device outside the substrate, surrounded by a pad portion provided with a doping of the second type; a sensing device comprising a sensor portion of the substrate provided with a doping of the first type, for sensing a parameter forming a measure for a local electrical potential of the substrate; and an evaluation unit connected to the sensing device, for providing an evaluation signal based on a difference between the parameter and a reference value.

20 Claims, 5 Drawing Sheets

(56) References Cited

U.S. PATENT DOCUMENTS

| | | |
|---|---|---|
| 5,168,340 A | 12/1992 | Nishimura |
| 5,641,978 A | 6/1997 | Jassowski |
| 5,694,072 A * | 12/1997 | Hsiao et al. .................. 327/537 |
| 5,949,109 A * | 9/1999 | Shimizu et al. ............... 257/355 |
| 7,506,951 B2 * | 3/2009 | Nishihara ....................... 347/19 |
| 2003/0122605 A1 * | 7/2003 | Ulrick et al. .................. 327/309 |
| 2006/0166426 A1 | 7/2006 | Voldman |
| 2007/0018193 A1 | 1/2007 | Ker et al. |
| 2007/0164774 A1 * | 7/2007 | Cecchi .......................... 324/769 |
| 2009/0244797 A1 * | 10/2009 | Sawahata ....................... 361/56 |
| 2010/0277205 A1 | 11/2010 | Roth et al. |

* cited by examiner

SEMICONDUCTOR DEVICE WITH APPRAISAL CIRCUITRY

FIELD OF THE INVENTION

This invention in general relates to semiconductor devices and more specifically to a semiconductor device with appraisal circuitry, a safety critical system and an apparatus including a semiconductor device with appraisal circuitry.

BACKGROUND OF THE INVENTION

Semiconductor integrated circuits are known in the art. Typically, integrated circuits include a package which contains one or more substrates or "dies". The substrates may be provided with electronic circuits and be provided with pads via which the substrates (and the electronic circuits) can be connected to the outside world, e.g. via bond-wires that are connected to pins which extend from the package inside to the exterior of the package.

However, a general problem is that current may be injected into the substrate, for example when a pad is driven below or above the supply voltage, which may affect the operation of the electronic circuit.

Depending on the arrangement of doped substrate and diffusion wells, a minority carrier current injection may be at least partly hindered while still allowing for majority carrier injection and vice versa. For example, embedding a pin with a connection to an n-diffusion sitting in a pwell sitting in an n-well on a p-type substrate (triple well technology or iso-lated pwell technology) may help preventing negative current injection into the substrate, while still enabling positive current injection via a p+ diffusion connected to the pin sitting in an nwell sitting in the p-type substrate, potentially triggering malfunction due to latch-up effects caused by parasitic structures.

In order to prevent the injected current from affecting the operation, it is known to implement a so called "guard ring" which shields the electronic circuit from the injected current. For example, FIG. 1 shows a schematic diagram of an example of a semiconductor device 10 with a guard ring 18 as a passive protection for an electronic circuit 14 that includes a circuit part 12 sensitive to current injected through a pad 16 of the device.

For example, U.S. Pat. No. 5,168,340 describes a passive latch-up protection improvement in which polysilicon lines cross or cut a guard-ring around a logic circuit. When an amount of injected current exceeds a certain magnitude, latch up of the transistors in the logic circuit occurs and the transistors are shut off.

German patent application publication DE 199 58 204 A1 discloses an integrated circuit provided with a sensor which senses the voltage of a pin and a transistor which is controlled by the sensor to block the connection between the pin and a core part of the integrated circuit when the voltage exceeds a first voltage threshold or comes below a second voltage threshold.

However, this does not provide a protection of the core part to currents flowing from the pin to the core part via other paths than the connection. In addition, if despite the blocked connection the core part is subject to an injected current, the operation of the core part can be affected in an unpredictable manner. Furthermore, since the path from the pin to the core parts is cut, a normal functioning of the device is no longer possible.

Applicant's copending and not pre-published International patent applications PCT/IB2007/054949 and PCT/IB2008/054987 disclose a semiconductor device which includes a substrate on which an electronic circuit is provided. Two or more pads may be present which can connect the electronic circuit to an external device outside the substrate. A current meter is electrically in contact with at least a part of the substrate and/or the pad. The meter can measure a parameter forming a measure for an aggregate amount of a current flowing between the substrate and said pads. A control unit is connected to the current meter and the electronic circuit, for controlling the electronic circuit based on the measured parameter.

SUMMARY OF THE INVENTION

The present invention provides a semiconductor device with appraisal circuitry, a safety critical system and an apparatus including a semiconductor device with appraisal circuitry as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Identical reference numerals in different figures refer to identical or similar components.

DETAILED DESCRIPTION OF THE PREFERRED EMBODIMENTS

Figure 1:
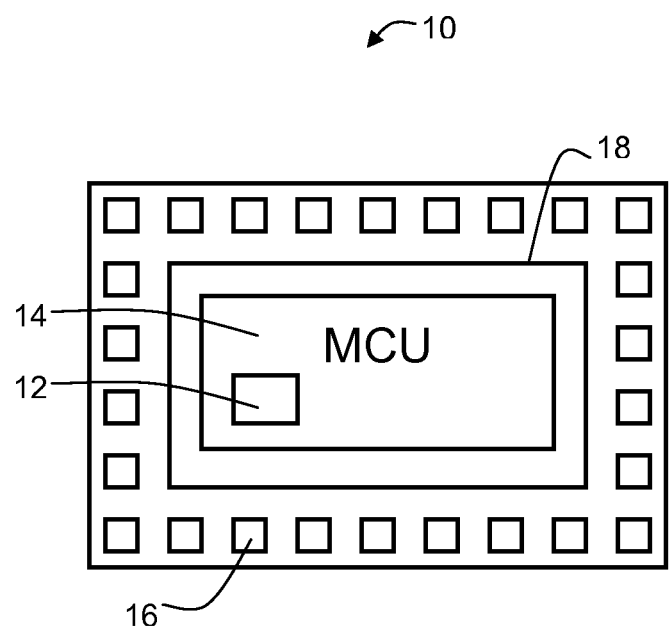
FIG. 1 shows a schematic diagram of an example of a prior art semiconductor device with a passive protection for an electronic circuit.
Figure 2:
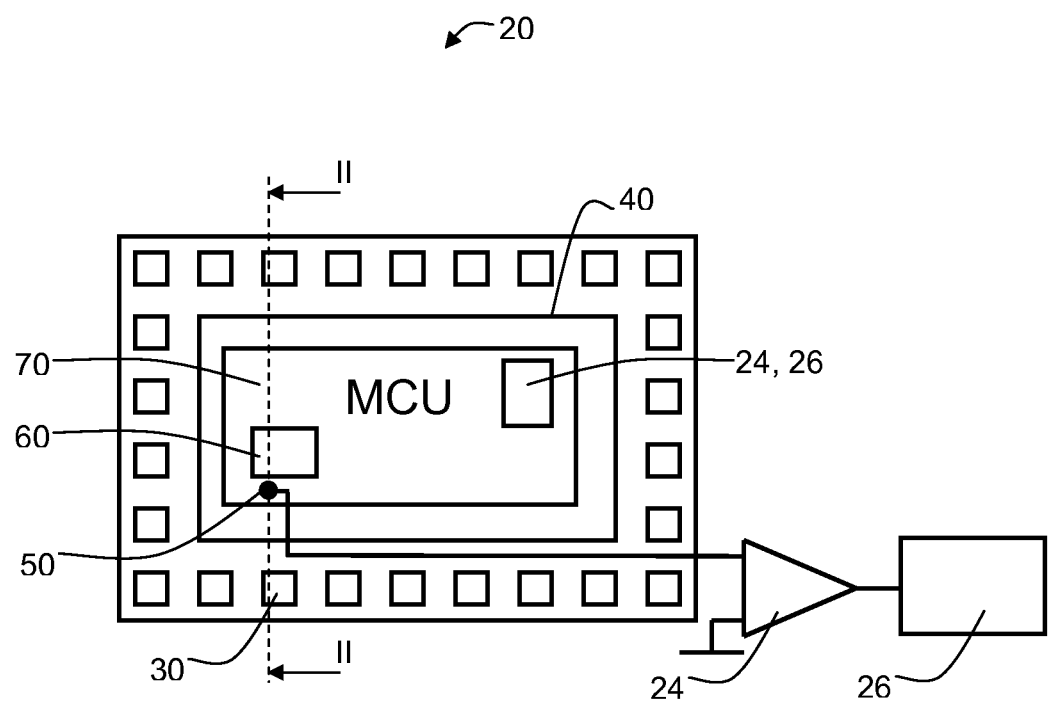
FIG. 2 shows a schematic diagram of a first example of an embodiment of a semiconductor device with appraisal circuitry.

Referring to FIG. 2, a schematic diagram of a first example of an embodiment of a semiconductor device 20 with appraisal circuitry is shown. The semiconductor device 20 may include a substrate on which an electronic circuit 60, 70 is provided. In this example, the electronic circuit is a logic circuit. The logic circuit may for example be a microprocessor and may for example include a central processing unit (CPU) and/or a graphics processing unit and/or a coprocessor and/or a digital signal processor and/or an embedded processor. The electronic circuit may also include a microcontroller (μC). In addition to or as an alternative to the logic circuit, other devices and/or circuitry may be present in the electronic circuit, such as for example high voltage device and/or volatile or non-volatile memory and/or analog circuitry like for example an analog-to-digital converter (ADC) or voltage monitors. Also, other electronic circuits may be present on the substrate.

As shown in FIG. 2, the semiconductor device may include multiple pads 30. Via the pads, the electronic circuit may be connected to an external device outside the substrate. Although not shown in FIG. 2, it will be apparent that an electrically conducting path, such as a metal line may be present between the pads and the part of the electronic circuit that has to receive signals from the external device and/or has to output signals to the external device. The external device may be any type of device, and may for example be a type of device that, e.g. unintentionally, may inject current into the substrate. The external device may for example be one or more of: an electronic device, an electro-motor, a piezo-electric device, a coil, a sensor, an actuator or other suitable type of device.

Figure 3:
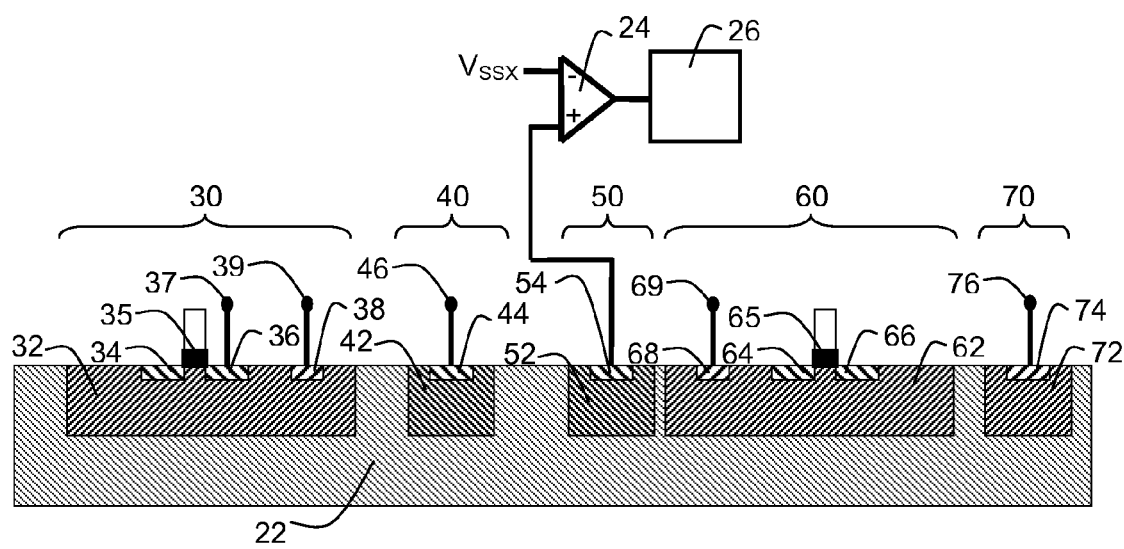
FIG. 3 shows a schematic diagram of a cross-sectional view of the example of FIG. 2 taken along a part of the line II-II in FIG. 2.

Referring also to FIG. 3, a schematic diagram of a cross-sectional view of the example of FIG. 2 taken along a part of the line II-II in FIG. 2 is provided. The semiconductor device 20 may comprise a substrate 22 provided with a doping of a first type, on which an electronic circuit 60 is provided, surrounded by a circuit portion 62 of the substrate provided with a doping of a second type; at least one pad 30 for connecting the electronic circuit to an external device outside the substrate surrounded by a pad portion 32 provided with a doping of the second type; a sensing device 50 comprising a sensor portion 52 of the substrate provided with a doping of the first type, for sensing a parameter forming a measure for a local electrical potential of the substrate; and an evaluation unit 24 connected to the sensing device, for providing an evaluation signal based on a difference between the parameter and a reference value.

The term "portion" of the substrate may for example refer to a diffusion well in the substrate.

The electronic circuit may comprise a non-sensitive part 70 and a sensitive part 60. A part of an electronic circuit may be a sensitive part, when an injected current, i.e. a current flowing between a pad 30 and the substrate 22, may cause malfunction or damage of the sensitive part 60 or other parts or the complete electronic circuit.

As an example, the substrate 22 shown in FIG. 3, may be p-doped, whereas the pad portion 32 may be n-doped, embedding a pad for example comprising a field effect transistor (FET) having p+ doped drain and source zones 34, 36 and a gateoxide zone 35 in contact with a polysilicon conductor, hence providing a pnp-transistor between zone 36, pad portion 32 and the substrate 22. The pad portion 32 may receive a voltage $V_{DDX}$, for example via an n+ doped zone 38, which may be connected to a positive supply voltage $V_{DDX}$ using terminal 39. When zone 36 connected to terminal 37 receives a voltage above supply voltage $V_{DDX}$ plus the forward voltage $V_{DIO}$ for switching the PN-junction diode 22, 32 into conductive state, a positive current may be injected into the substrate 22.

The substrate may for example have a high resistivity. Injecting positive current may cause the electrical potential of the substrate 22 to lift. If for example the electronic circuit comprises one or more additional n-well diffusions or circuit portions 70, a lateral "parasitic" npn-transistor device given by circuit portion 62, substrate 22 and additional circuit portion 72 may receive a base current. For example in case of different potentials present at circuit portion 62, for example due to a weak bias 69 received at diffusion zone 68 which may for example be n+ doped compared to for example $V_{DDX}$ applied via terminal 76 to a diffusion zone 74 which may also for example be n+ doped and therefore additional circuit portion 72, an unwanted current flow between possibly unrelated n-type diffusion wells 72 and 62 may occur, which may adversely affect or even put out of order function of the electronic circuit 60. This may for example apply when a lateral transistor receives at least 1 $V_{BE}$ (about 0.7V). For illustrative purposes, a FET with source 64, gate 65 and drain 66 is shown which forms a part of the electronic circuit. In case of current injection, the substrate potential close to an electronic circuit may for example increase by several volts depending on the distance from the injecting pad, the collecting guard ring and the level of supply voltage. Latch-up effects may occur at cngate 65. However, before latch-up may occur, parts of the electronic circuit, e.g. amplifiers may malfunction.

As shown in FIG. 3, by placing a sensing device 50 on the substrate 22 that may for example comprise a p-well diffusion sensor portion 52 including a p+ diffusion zone 54, the electrical potential of the sensor portion 52 and with this parameter the electrical potential of the substrate 22, at least the neighbouring substrate region, may be sensed.

The evaluation unit 24 connected to the sensing device may be used for providing an evaluation signal. This signal may for example be a differential voltage between the sensed parameter and for example $V_{SSX}$, which may be ground voltage, as a reference value. An electrical potential of the substrate in case of no current injection may for example be ground potential, e.g. $V_{SSX}$.

Sensing a variation in electrical potential of the substrate 22 allows for directly sensing a (possibly injected) current flowing in the substrate. The sensing may for example be performed continuously at any time.

The described configuration may apply to the described example. However, it should be noted that the same principles may be applied to different configurations, for example to semiconductor devices using a n-type substrate. In that case all p-dopings as described in the example above may for example be n-dopings and all voltages $V_{DDX}$ applied may for example be replaced by $V_{SSX}$ and vice versa, i.e. terminal 37 may receive $V < V_{SSX} - V_{DIO}$ instead of $V > V_{DDX} + V_{DIO}$, terminal 39 may receive $V_{SSX}$ instead of $V_{DDX}$, and terminal 76 may receive $V_{SSX}$ instead of $V_{DDX}$. And, as will be explained later in the text, guard ring terminal 46 may receive $V_{DDX}$ instead of $V_{SSX}$.

The semiconductor device may comprise a control unit 26 and the evaluation unit 24 may provide the evaluation signal to the control unit. Therefore, the control unit 26 may be made aware of a potentially threatening condition. The control unit 26 may control an operation mode of the electronic circuit 60 depending on the evaluation signal. The evaluation signal may convey an amount of disturbance caused by current injection or may be just a flag indicating that a certain threshold has been exceeded. The control unit 26 may, for example, take measures which prevent the electronic circuit 60 from performing in an abrupt and unpredictable manner or which prevent a loss of data when the electronic circuit comes to a halt due to the injected current. The control unit 26 may for example switch the electronic circuit 60 to a more secure mode when a certain amount of current flow is detected or cause the electronic circuit to store data processing information in a non-volatile memory. Also, the control 26 unit may stop or halt the operating of the electronic device (and e.g. cause a redundant electronic device to take over the operation) until the level of injected current is below a safe operating threshold.

The electronic circuit may for instance have a normal mode and one, two or more non-normal modes. For example, the electronic circuit may have a multiple of non-normal modes in addition to the normal mode. The electronic circuit 60 may be put in a selected non-normal mode based on the measured amount of current. For example, the non-normal modes may have different levels of safety. The non-normal mode may then be selected with the levels of safety proportional to the measured substrate potential. For example, the non-normal may be (in order of safety level) e.g. a watch mode, an analog measure disabled mode, a no RAM access mode, a no flash access mode, a security halt mode. In the watch mode, the substrate potential may be measured continuously. In the analog measure disabled mode, analog components may be switched off. In the no RAM access mode the Random Access Memory (RAM) may be disabled. In the no flash access mode, the access to flash memory may be blocked and in the security halt mode the electronic circuit may be halted.

The control unit 26 may include a selection unit and a mode-controller connected to the evaluation unit 24. The selection unit and the mode-controller may be a single module. However it will be apparent that they may be provided as separate modules. The selection unit may for example select a non-normal mode based on the measured parameter. The selection unit may for example compare the evaluation signal with two or more threshold values Tr1, Tr2 and select the non-normal mode depending on which threshold values are exceeded (e.g. select a less secure mode if a lower threshold Tr1 is exceeded and select a more secure mode if a higher threshold Tr2 is exceeded. The mode controller may then control the electronic circuit to be in a selected non-normal mode.

The location as well as the dimensions of the sensor 50 may influence the measured parameter. For example, the sensor portion 52 of the substrate may be located between the pad portion 32 and the circuit portion 62. By placing the sensor in a path of a potentially injected current, the measured change of substrate potential may directly correspond to the current injection. In order to efficiently protect a sensitive circuit 60, the sensing portion 52 may for example be located nearby to the circuit portion 62, enabling a substrate pickup nearby the possible victim circuit. However, in another embodiment, the sensor portion 52 may be placed close to a pad portion 32, for example when a pad is considered a potential aggressor, i.e. it is considered to be a particular source of current injection.

The sensing device 50 may sense a local electrical potential of a region of the substrate close to the sensor portion 52. This may be achieved by using a particularly small-sized sensor portion covering a region of the substrate that is for example smaller than the circuit portion 62 or the pad portion 32. This may provide a precise, distinctive sensed signal of a strength above disturbances due to noise. However, the size of the sensor portion 52 may in other embodiments be chosen to cover a larger region of the substrate 22 in order to measure an aggregated amount of potential shift in the substrate.

In any case, the difference between the parameter forming a measure for the electrical potential of the substrate and the reference value may depend on a current injected through the pad into the substrate. Although current injection may occur differently, the most likely source of current injection may be a pad connecting to an external device. For example, semiconductor devices in an automotive application may be subject to unwanted current injection, for example due to different supply voltages used. While an external device may for example receive a 12V supply voltage, a semiconductor device being a victim of current injection may for example receive a 5V supply voltage.

Generally, pads may for example be connected to diffusions for ESD protection purposes and optionally to output drivers if the pad is an output or IO pin. The described example configuration of doped regions may help reduce or prevent an injection of a minority carrier current. However, the injected current may for example be a majority carrier current. The described example configuration using triple well technology may at least partly inhibit the injection of a minority carrier current into the substrate while still allowing for a majority carrier current injection via the pad connected to a p-type diffusion sitting in an nwell sitting in the p-type substrate. It should be noted that for a configuration using for example an n-type diffusion sitting in a pwell pad portion sitting in an n-type substrate, the majority carrier current may be a negative current.

As shown in FIG. 3, a guard ring barrier 40 comprising for example a well 42 with a doping of the doping of the substrate, for example a p-doping when the substrate is p-doped, embedding a p+ diffusion zone 44 may for example be used for passive protection of the electronic circuit 60. The barrier may at least partly inhibit a current flow between the electronic circuit 60 and one or more pads 30. The barrier 40 may at least partly enclose the circuit portion 62 or may be located between the injecting pad 30 and the electronic circuit 60. By setting the electrical potential of the guard ring 40 via terminal 46 for example to a potential $V_{SSX}$, $V_{SSX}$ may be ground potential, for example ground potential of the external device that may be connected to the sensing device, for example via a metal line. This may cause at least a part of the injected current to be removed from the substrate 22. However, for an n-type guard ring in an n-type substrate, a potential $V_{DDX}$ may be applied via terminal 46.

In order not to distract the sensed substrate potential, as few current as possible may be drawn from the substrate by the sensing device. Therefore, the evaluation unit 24 may be an active device. It may be a comparator providing as an evaluation signal a flag indicating a presence of an unusual substrate potential, for example caused by injected current. However, the evaluation unit 24 may comprise an amplifier amplifying the measured difference, and hence, a change of the measured electrical substrate potential, for example as a continuous evaluation signal. The evaluation unit 24 may comprise an analog-to-digital converter converting the analog difference signal into a digital representation allowing for example a control unit 26 to easily set different modes of operation of the electrical circuit in response to the measured change of the substrate potential.

The evaluation unit 24 may be a part of the electronic circuit 60, 70. In case of a presence of a control unit 26, it may instead or additionally be a part of the electronic circuit. Accordingly, the evaluation unit 24 and/or the control unit 26 may be at least partly be located on the substrate 22. The provided appraisal circuitry comprising the sensor, the evaluation unit and probably a control unit may for example add less than 0.1 mm² onto a size of a die.

The electronic circuit 60, 70 may include one or more of a group consisting of: microprocessor, central processing unit, a graphics processor, coprocessor, digital signal processor, embedded processor, graphics processor, application specific integrated circuit (ASIC), analogue-to-digital converter, field programmable gate array (FPGA), a device implementing a state machine, a microcontroller unit (MCU).

Figure 4:
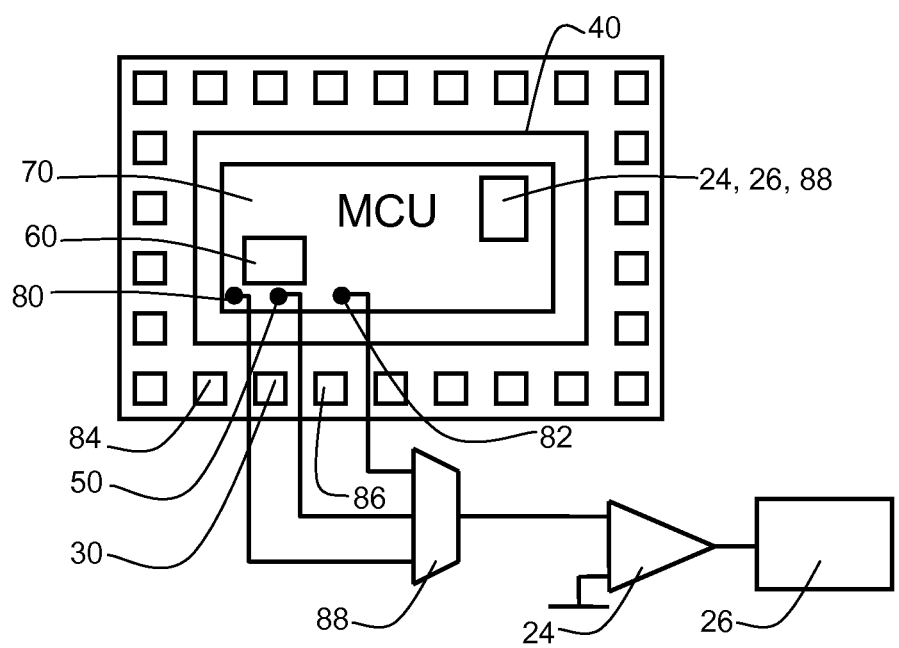
FIG. 4 shows a schematic diagram of a second example of a semiconductor device with appraisal circuitry.

Referring now to FIG. 4, a second example of an embodiment of a semiconductor device with appraisal circuitry is shown. Only components different from the first embodiment shown in FIG. 2 will be described in detail. The semiconductor device may comprise one or more additional sensing devices 80, 82, each comprising an additional sensor portion of the substrate, for sensing a parameter forming a measure for a local electrical potential of a region of the substrate close to the additional sensor portion. The sensor 50 and the additional sensors 870, 82 may for example be placed nearby pins 30, 84, 86 of the semiconductor device. For example, a multiplexer 88 may be used to provide the sensed parameter values to the evaluation unit 24. As shown in FIG. 4, one or all of the appraisal circuitry comprising here the multiplexer 88, evaluation unit 24 and control unit 26 may be located on chip. The shown additional sensors 80, 82 may be taken as an example. Other implementations may comprise less or more additional sensors, for example one sensor for each pin. A configuration using many sensors may for example be used during device development prior to production. By implementing a large number of sensors around the electronic device or for example close to every pad, this may for instance allow detailed analysis of important points in the MCU during current injection scenarios. Hence, product evaluation could entail applying current injection at different points, whilst then allow all parts of the circuit to be 'actively' assessed for the level of current injection.

As shown in FIG. 4, the one or more additional sensing devices 80, 82 may also be connected to the evaluation unit 24. Possible protective measurements may affect the whole electronic circuit 60, 70. However, other embodiments may comprise separate evaluation units.

A semiconductor device with appraisal circuitry as described above may be comprised in a safety critical system. A safety critical system may benefit from an additional level of security, robustness and reliability and may for example be any application wherein unexpected malfunction could for example cause a potentially dangerous situation for a user.

Figure 5:
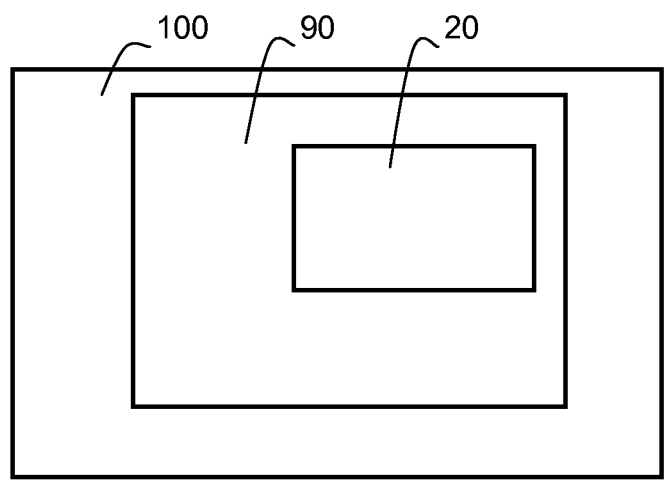
FIG. 5 shows a schematic diagram of an apparatus comprising a safety critical system with a semiconductor device with appraisal circuitry.

Referring now also to FIG. 5, a schematic diagram of an apparatus 100 comprising a safety critical system 90 having a semiconductor device 20 with appraisal circuitry is shown. An apparatus 100 may comprise a semiconductor device 90 or a safety critical system 20 as described above. An apparatus 100 may for example be a vehicle, for example a car, a plane, a ship, a helicopter etc. A safety critical system may be found, for example, in an automotive environment and may be, for example, a car safety system. A safety critical system may comprise a seat position control system, lighting, windscreen wipers, immobilizers, electronic climate control, a brake system or an electrical steering system. A brake system may comprise, for example, an anti-lock braking system (ABS), an electronic brakeforce distribution system (EBD), a cornering brake control (CBC) system etc. An electrical steering system may comprise, for example, an electronic stability control system (ESC), a traction control system (TCS) or anti-slip regulation system (ASR), an adaptive cruise control (ACC) system, a forward collision warning (FCW) system etc. However, the semiconductor device may also be used for other car systems, such as the dashboard.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, the example of an evaluation unit shown in FIG. 2 may be implemented using a discrete amplifier electrically connected to the semiconductor substrate 22.

The semiconductor substrate described herein can be any semiconductor material or combinations of materials, such as gallium arsenide, silicon germanium, silicon, monocrystalline silicon, the like, and combinations of the above, just to name a few.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Also, devices functionally forming separate devices may be integrated in a single physical device. For example, the evaluation unit and the control unit in the example of FIG. 2 may be implemented on the same semiconductor substrate.

Furthermore, the sensor and/or guard ring may be implemented in a different manner than shown in the examples.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A semiconductor device, comprising a substrate provided with a doping of a first type, on which an electronic circuit is provided surrounded by a circuit portion of said substrate provided with a doping of a second type;
  at least one pad for connecting said electronic circuit to an external device outside said substrate, surrounded by a pad portion provided with a doping of said second type;
  a sensing device comprising a sensor portion of said substrate provided with a doping of said first type, for sensing a parameter forming a measure for a local electrical potential of said substrate; and
  an evaluation unit connected to said sensing device, for providing an evaluation signal based on a difference between said parameter and a reference value.

2. The semiconductor device as claimed in claim 1, further comprising a control unit configured to control an operation mode of said electronic circuit depending on said evaluation signal.

3. The semiconductor device as claimed in claim 1, wherein said sensor portion is located between said pad portion and said circuit portion.

4. The semiconductor device as claimed in claim 1, wherein said sensing device is configured to sense a local electrical potential of a region of said substrate close to said sensor portion.

5. The semiconductor device as claimed in claim 1, wherein said difference depends on a current injected through said pad into said substrate.

6. The semiconductor device as claimed in claim 5, wherein said injected current is a majority carrier current.

7. The semiconductor device as claimed in claim 1, wherein a barrier configured to at least partially inhibit a current flow between said electronic circuit and said one or more pads is provided, at least partly enclosing said circuit portion.

8. The semiconductor device as claimed in claim 1, wherein said evaluation unit is an active device.

9. The semiconductor device as claimed in claim 1, wherein said evaluation unit comprises an amplifier.

10. The semiconductor device as claimed in claim 1, wherein said evaluation unit is a part of said electronic circuit.

11. The semiconductor device as claimed in claim 1, wherein said electronic circuit includes one or more of a group comprising: microprocessor, central processing unit, a graphics processor, coprocessor, digital signal processor, embedded processor, graphics processor, application specific integrated circuit (ASIC), analogue-to-digital converter, field programmable gate array (FPGA), a device implementing a state machine, a microcontroller unit (MCU).

12. The semiconductor device as claimed in claim 1, comprising:
  one or more additional sensing devices, wherein
    each additional sensing device comprises an additional sensor portion of said substrate,
    each additional sensing device is configured to sense a parameter forming a measure for a local electrical potential of a region of said substrate close to said additional sensor portion.

13. The semiconductor device as claimed in claim 12, wherein said one or more additional sensing devices are connected to said evaluation unit.

14. A safety critical system, comprising a semiconductor device as claimed in claim 1.

15. An apparatus (100), comprising a semiconductor device as claimed in claim 1 or a safety critical system.

16. The semiconductor device as claimed in claim 2, wherein said sensing device is configured to sense a local electrical potential of a region of said substrate close to said sensor portion.

17. The semiconductor device as claimed in claim 3, wherein said difference depends on a current injected through said pad into said substrate.

18. The semiconductor device as claimed in claim 3, wherein a barrier configured to at least partially inhibit a current flow between said electronic circuit and said one or more pads is provided, at least partly enclosing said circuit portion.

19. The semiconductor device as claimed in claim 2, comprising:
  one or more additional sensing devices, wherein
    each additional sensing device comprises an additional sensor portion of said substrate,
    each additional sensing device is configured to sense a parameter forming a measure for a local electrical potential of a region of said substrate close to said additional sensor portion.

20. The semiconductor device as claimed in claim 18, comprising:
  one or more additional sensing devices, wherein
    each additional sensing device comprises an additional sensor portion of said substrate,
    each additional sensing device is configured to sense a parameter forming a measure for a local electrical potential of a region of said substrate close to said additional sensor portion.

* * * * *